United States Patent [19]

Kenney

[11] Patent Number: 4,785,337

[45] Date of Patent: Nov. 15, 1988

[54] DYNAMIC RAM CELL HAVING SHARED TRENCH STORAGE CAPACITOR WITH SIDEWALL-DEFINED BRIDGE CONTACTS AND GATE ELECTRODES

[75] Inventor: Donald M. Kenney, Shelburne, Vt.

[73] Assignee: International Business Machines Corporation, Armonk, N.Y.

[21] Appl. No.: 919,940

[22] Filed: Oct. 17, 1986

[51] Int. Cl.$^4$ ............................................ H01L 29/78
[52] U.S. Cl. .................................. 357/23.6; 357/55; 357/65; 357/68; 365/149
[58] Field of Search .................... 357/23.6, 59 G, 55, 357/51, 65, 68; 365/149, 182

[56] References Cited

U.S. PATENT DOCUMENTS

| | | |
|---|---|---|
| Re. 32,090 | 3/1986 | Jaccodine et al. ............... 357/51 |
| 3,387,286 | 6/1968 | Dennard ...................... 357/23.6 |
| 4,256,514 | 3/1981 | Pagge ......................... 148/1.5 |
| 4,322,883 | 4/1982 | Abbas et al. .................... 29/578 |
| 4,329,704 | 5/1982 | Sakurai et al. .................. 357/41 |
| 4,369,564 | 1/1983 | Hiltpold ........................ 29/571 |
| 4,378,627 | 4/1983 | Jambotkar ...................... 29/571 |
| 4,419,809 | 12/1983 | Riseman et al. .................. 29/571 |
| 4,688,063 | 8/1987 | Lu ............................ 357/23.6 |

FOREIGN PATENT DOCUMENTS

| | | |
|---|---|---|
| 150597 | 12/1984 | European Pat. Off. . |
| 0164829 | 12/1985 | European Pat. Off. . |
| 0177066 | 4/1986 | European Pat. Off. . |
| 60-068647 | 9/1983 | Japan . |
| 59-141262 | 8/1984 | Japan . |
| 61-88555 | 5/1986 | Japan . |

OTHER PUBLICATIONS

IBM Technical Disclosure Bulletin, vol. 29, #3, pp. 1421–1422, Aug. 1986.
G. V. Clarke, "Capacitor for Single FET Memory Cell," Feb. 75, vol. 17, No. 9, IBM Technical Disclosure Bulletin, pp. 2579–2580.
R. C. Dockerty, "High–Capacitance, One–Device Memory Cell," Jul. 76, vol. 19, No. 2, IBM Technial Disclosure Bulletin, p. 506.
S. Nakajima et al., "An Isolation–Merged Vertical Capacitor Cell for Large Capacity DRAM," pp. 240–243, IEDM 1984.
T. Furuyama et al., "A Vertical Capacitor Cell for ULSI DRAM's," VLSI, 9/10/84.

Primary Examiner—Andrew J. James
Assistant Examiner—Mark Prenty
Attorney, Agent, or Firm—Mark F. Chadurjian

[57] ABSTRACT

A one-device shared trench memory cell, in which the polysilicon and dielectric layers within the trench extend above the surface of the trench to form a mandrel structure. A layer of polysilicon is conformably deposited on the mandrel structure. Dopant ions are diffused from the doped polysilicon within the trench to the conformal polysilicon layer, and from the conformal polysilicon layer, and from the conformal polysilicon layer to a portion of the substrate disposed thereunder. The conformal polysilicon is etched in a solvent that preferentially attacks undoped polysilicon, to provide and is a bridge contact that is self-aligned to the polysilicon within the trench and to the diffusion region. A plurality of FETs formed on either side of the trench, by use of a sidewall-defined gate electrode to maximize density. The cell produces a "poly-to-poly" and "poly-to-substrate" storage capacitor combination that maximizes charge storage capability.

18 Claims, 6 Drawing Sheets

DYNAMIC RAM CELL HAVING SHARED TRENCH STORAGE CAPACITOR WITH SIDEWALL-DEFINED BRIDGE CONTACTS AND GATE ELECTRODES

TECHNICAL FIELD

The present invention relates to dynamic random access memory (DRAM) cells incorporating a trench storage capacitor.

CROSS-REFERENCE TO RELATED APPLICATIONS

Reference is made to commonly-assigned U.S. patent application Ser. No. 626,512, entitled "Dynamic RAM Cell with MOS Trench Capacitor in CMOS," filed June 29, 1984 by Lu et al and now abandoned. This application relates to a trench cell in which a polysilicon-filled trench extends through a well region formed on an epitaxial region, into the underlying substrate. The resulting poly-to-substrate storage capacitance is considerably enhanced.

Reference is made to commonly-assigned U.S. patent application Ser. No. 858,787, entitled "High Density Vertically Structured Memory," filed May 2, 1986 by Fitzgerald et al. This application relates to a dynamic memory cell incorporating a shared trench capacitor.

Reference is made to commonly-assigned U.S. patent application Ser. No. 793,401, entitled "High Density Memory," filed Oct. 31, 1985 by the present inventor and now U.S. Pat. No. 4,751,558. This application relates to a DRAM trench cell in which a polycrystalline silicon (polysilicon) capacitor electrode is disposed on the bottom of the trench and the gate electrode of the transfer gate field effect transistor (FET) is disposed on the sidewall of the trench so as to define a vertical channel region between the diffused capacitor electrode and the diffused bit line formed on a portion of silicon defined by adjacent trenches.

Reference is made to commonly-assigned U.S. patent application Ser. No. 885,618, entitled "Two Square Memory Cells," filed July 15, 1986 by Garnache et al. This application relates to a DRAM trench cell in which the bottom portion of the trench is filled with polysilicon to define separate storage capacitors on each side of the trench, and the upper portion of the trench has gate electrodes so that a conductive channel is formed along the sidewalls of the trench.

BACKGROUND ART

Dynamic random access memory "one-device" cells, consisting of a storage capacitor and a single transistor controlling the charge/discharge of the capacitor, were first disclosed in commonly-assigned U.S. Pat. No. 3,387,286, to Dennard. Since then, a host of related designs have proliferated in the memory art. In general, these designs have been directed to increasing the storage capacitance of the capacitor, or decreasing the amount of chip area that is taken up by each memory cell.

A combination of these trends in the art has led to the development of the so-called "trench storage cell." A trench or groove is defined in a silicon substrate, and is filled with a conductive material such as polysilicon. Since the size of the capacitor electrode has increased without taking up chip surface area, a greater amount of charge can be stored in a smaller area. Among the first disclosures of this general idea were an article by Clarke et al, entitled "Capacitor For Single FET Memory Cell," *IBM Technical Disclosure Bulletin*, Vol. 17, No. 9, February 1975, pp. 2579–2580 (in FIG. 2, polysilicon 22 is formed within an insulated groove to provide an enhanced storage capacitance), and an article by Dockerty, entitled "High-Capacitance, One-Device Cell," *IBM Technical Disclosure Bulletin*, Vol. 19, No. 2, July 1976, p. 506 (in FIG. 3, a 5 $\mu$m trench is filled with "porous silicon" to enhance storage capacitance).

Other teachings in the art have "shared" the capacitance produced by a filled trench between two adjacent FETs. This has further reduced the amount of chip space utilized per memory cell. See the abovecited Clarke article, in which either side of the V-groove trench forms the storage capacitor for adjacent memory cells. Japanese Published Patent Application JP No. 61-068,647 (published Apr. 19, 1985, based on Japanese Patent Application JP No. 58-177,231, filed Sept. 26, 1983) apparently discloses a trench cell in which the poly-filled trench is etched such that two separate polysilicon structures are formed on each sidewall of the trench. The structures are separated by air. Each structure appears to form a plate electrode for a capacitor associated with an adjacent FET. The capacitor appears to provide an inversion region which provides charge to a drain region when a channel is induced in the FET. See U.S. Pat. No. 4,329,704 (issued May 11, 1982 to Sakurai et al) for a teaching of a "buried" storage capacitor.

In some cases, the use of the word "trench" may be a misnomer. Many of the so-called "trenches" are actually discrete apertures that are formed in the substrate. See e.g. an article by Nakajima et al, "An Isolation-Merged Vertical Capacitor Cell For Large Capacity DRAM," *IEDM Digest of Technical Papers* 1984, Paper 9.4, pp. 240–243. In FIG. 2 the "trench" that is filled with discrete layers of poly is shown as being a square aperture. More recently, trench cells have been proposed in which an elongated aperture (i.e., a true "trench") is filled with polysilicon to define a plurality of sidewall capacitors. See Furuyama et al, "A Vertical Capacitor Cell For Large Capacity DRAM," *VLSI Symposium on Integrated Circuits*, September 1984, Paper 1-7, pp. 16–17, in which an elongated trench is filled with polysilicon to form a series of memory cells. Adjacent cells are isolated by orthogonal trenches that are filled with silicon dioxide. See also U.S. Pat. No. 4,369,564 (issued Jan. 25, 1983 to Hiltpold), wherein a single V-groove is shared by two adjacent memory cells, the midpoint of the groove having a thicker layer of oxide in order to separate the adjacent cells from each other; U.S. Pat. No. Re. 32,090 (issued Mar. 4, 1986 to Jaccodine), wherein parallel polysilicon-filled trenches have FETs disposed between them, one side of each trench providing a storage capacitor for the FET and the other side of each trench being isolated from the next FET by a channel stop region; and European Patent Application EP No. 150,597 (published Aug. 7, 1985, based on Japanese Patent Application No. 59-004,364), wherein parallel trenches are alternatively filled with capacitor defining polysilicon layers and an isolating layer, such that every other trench isolates adjacent polyfilled trenches from one another.

The general idea of the so-called "sidewall structures" is also known in the art. As disclosed in commonly-assigned U.S. Pat. No. 4,256,514 (issued Mar. 17, 1981 to Pogge et al), a conformal film of material is coated on a "block" or "mandrel structure" that has an upper horizontal surface and vertical surfaces. The film is directionally etched such that it is removed from the horizontal surface of the mandrel. The remaining conformal material forms a sidewall-defined structure that has a horizontal width which is controlled as a function of the original film thickness of the material. In U.S. Pat. No. 4,322,883 (issued Apr. 6, 1982 to Abbas et al and assigned to the assignee of the present invention), this general idea is used to define polysilicon sidewall-defined structures 28, which are then oxidized to form sidewalls 30 for isolating adjacent bipolar contacts from one another. A residual portion of the original sidewall may be left in place (it is not critical to the operation of the device). See also U.S. Pat. No. 4,378,627 (issued Apr. 5, 1983 to Jambotkar and assigned to the assignee of the present invention), wherein sidewall regions 26 are defined in N+ silicon regions 18 to provide isolation from an overlaying N+ layer 30 that is subsequently etched to define a gate electrode; and U.S. Pat. No. 4,419,809 (issued Dec. 13, 1983 to Riseman et al and assigned to the assignee of the present invention), wherein conductive sidewall structures 26 form the gate electrodes of FETs. Note that in FIG. 11 of the Riseman patent, the mandrel structure that is used to define the sidewall structures is formed over a semi-recessed oxidation region 12, such that the gate electoodes are spaced from either side of region 12. Finally, note that in the above-cited pending U.S. patent application Ser. No. 885,618, sidewall structures are formed within a partially-filled trench to define the gate electrodes of the FETs associated with the storage capacitors defined by the lower portions of each side of the trench.

Heretofore, the present inventor is unaware of any known teachings that relate to utilizing sidewall structures to efficiently define bridge contacts and gate electrodes on either side of a completely filled trench, in which the conductive materials coated within the trench extend above the surface of the substrate to define a mandrel structure.

SUMMARY OF THE INVENTION

It is therefore an object of the present invention to construct a dense dynamic random access memory cell.

It is another object of the present invention to construct a dense dynamic random access memory cell having a high capacitance trench storage capacitor.

It is yet another object of the present invention to produce a trench storage capacitor that has an efficient means for coupling the filled trench to an associated FET device.

These and other objects of the present invention are realized by a novel random access memory cell in which a trench has a layer of polysilicon that extends above the surface of the substrate, a sidewall-defined bridge contact being defined on the sidewall of the polysilicon fill for coupling to the source electrode of an associated FET device.

In another aspect of the invention, the elongated trench is filled with a first dielectric layer, a thin doped polysilicon layer, a second dielectric layer, and a thick doped polysilicon layer. The trench extends through a well region formed on an epitaxial region grown on the substrate, and also extends through the epitaxial region into the substrate. Portions of the thin polysilicon layer, the second dielectric layer, and the thick polysilicon layer extend above the surface of the substrate. The sidewall-defined bridge contact couples the thin doped polysilicon layer to the source diffusion. The thick doped polysilicon layer, the second dielectric layer, and the thin doped polysilicon layer cooperate to provide a "poly-to-poly" storage capacitance, and the thin polysilicon layer, the first dielectric layer, and the substrate cooperate to form a "poly-to-substrate" storage capacitance. In combination, the two storage capacitances greatly increase the ability of the one device memory cell to store charge.

In a further aspect of the invention, the sides of the elongated trench provide independent storage capacitances for a plurality of FET devices formed in a spaced relationship along either side of the trench. The elongated trench is filled with at least one doped polysilicon layer and at least one dielectric layer. The polysilicon layer extends above the surface of the substrate to define a mandrel structure. The sidewall-defined contacts are provided on either side of the trench to couple each side portion of the polysilicon fill to an adjacent source diffusion of a respective FET. A sidewall-defined insulating layer protects the sidewall contact from a sidewall-defined gate electrode for the respective FET. The resulting structure presents a particularly dense random access memory cell that utilizes a shared trench storage capacitor.

BRIEF DESCRIPTION OF THE DRAWING

The foregoing and other aspects of the invention will become more apparent upon a description of the best mode for carrying out the invention, as rendered below. In the description to follow, reference will be made to the accompanying Drawing, in which.

DESCRIPTION OF THE BEST MODE FOR CARRYING OUT THE INVENTION

Figure 1:
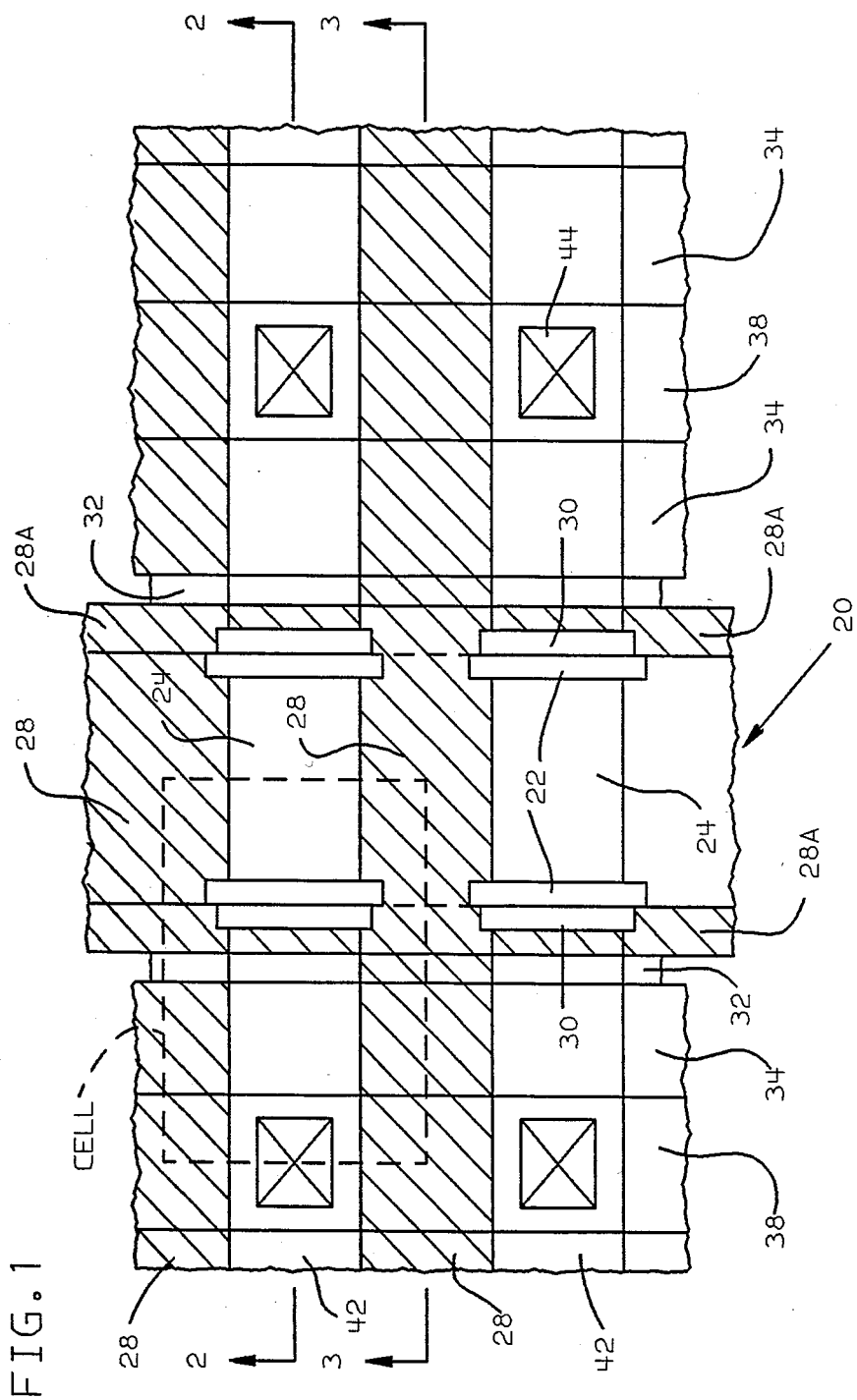
FIG. 1 is a top view of an array of random access memory cells constructed in accordance with the teachings of the present invention.
Figure 2:
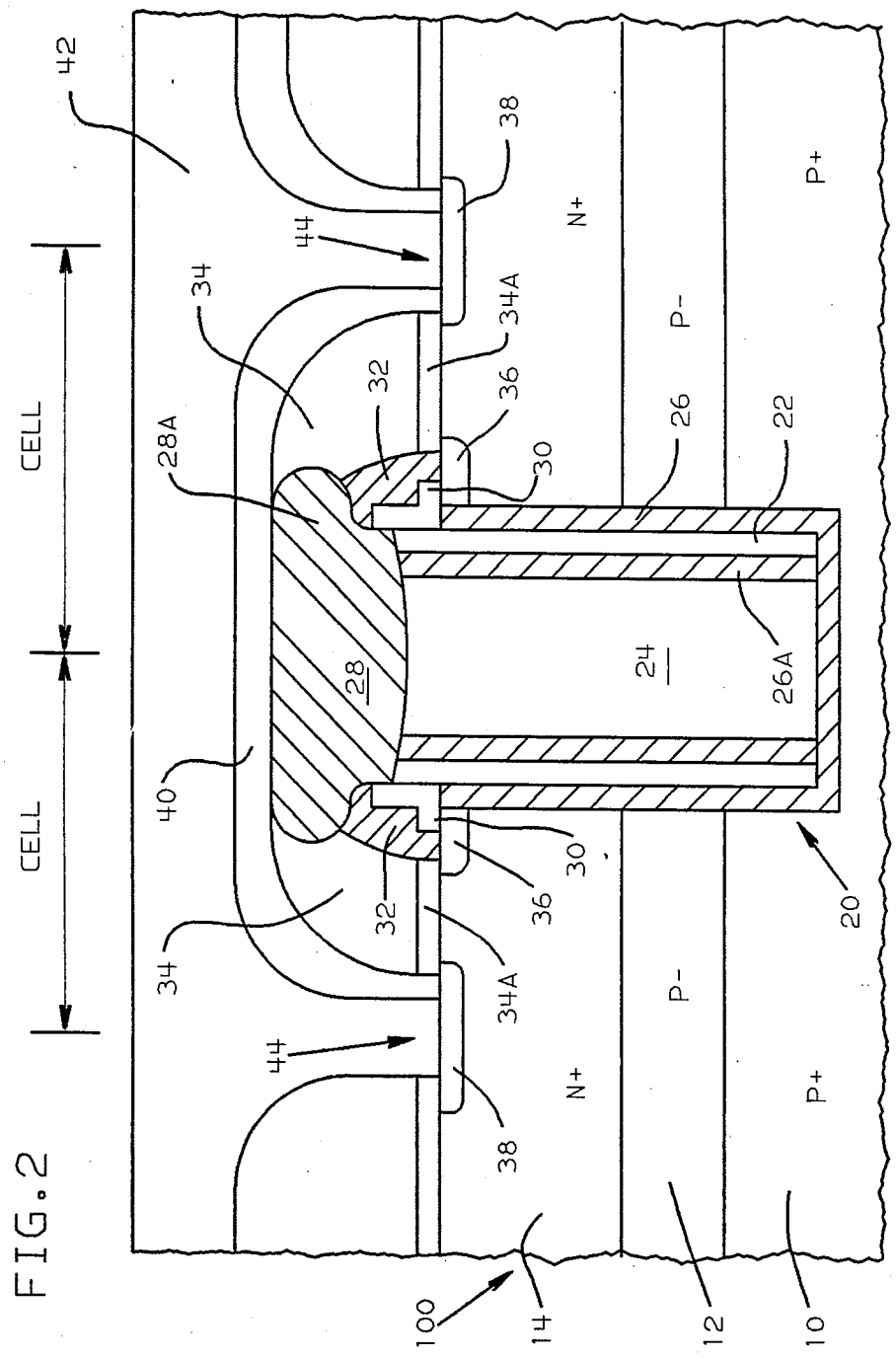
FIG. 2 is a cross-sectional view taken along line 2—2 of FIG. 1.

With reference to FIGS. 1 and 2, the structure of the random access memory cell of the present invention will now be described. The cell is based on a CMOS processing technology. The cell is formed on a wafer 100. The wafer 100 has three components. The first component is a P+ type, <100> oriented monocrystalline silicon substrate 10. The monocrystalline substrate 10 has a boron dopant concentration in the order of $10^{19}$ ions/cm$^3$. A P− type epitaxial layer 12 overlays monocrystalline substrate 10. The epitaxial layer has a boron dopant concentration in the order of $10^{15}$ ions/cm$^3$. An N+ type well region 14 is formed in portions of the epitaxial layer 12 where memory cells are to be formed. The n-well region 14 has an arsenic dopant concentration in the order of $10^{17}$ ions/cm$^3$.

A trench 20 extends through n-well 14 and epitaxial layer 12 to monocrystalline substrate 10. As shown in FIG. 1, the trench 20 is elongated (i.e., it runs along the surface of wafer 100). A series of these trenches are formed in parallel. The trench 20 is filled with two layers of doped polysilicon. The first layer of polysilicon 22 is formed along the sidewalls of the trench. The second layer of polysilicon 24 fills the trench. Note that both layers of polysilicon 22, 24 extend from the trench 20 to a point above the surface of wafer 100. The processing method for forming this "overfill" structure will be described below. There are also two dielectric layers disposed along the sidewalls of the trench. A first dielectric layer 26 insulates the first layer of polysilicon 22 from substrate 100. The second dielectric layer 26A insulates the second polysilicon layer 24 from the first polysilicon layer 22. A layer of silicon oxide 28 is formed over the upper surface of the trench fill. Note that the silicon oxide region 28 has lateral portions 28A that extend beyond the sides of the trench fill.

A field effect transistor (FET) is formed on either side of the trench 20. Each FET includes a sidewall-defined gate electrode 34 insulated from wafer 100 by a gate insulator 34A, a diffused source electrode 36 and a diffused drain electrode 38. The gate electrode is part of a continuous word line that is disposed on either side of the trench 20 so that all of the FETs on one side of the trench can be accessed at the same time (see FIG. 1). The diffusion region 38 serves as a shared drain electrode for adjacent FETs that access adjacent trench capacitors. The drain electrode 38 is coupled at a contact area 44 to a bit line conductor 42, which is disposed in a direction orthogonal to that of the trench 20 to couple a plurality of the drain electrodes 38 together to form a memory array (see FIG. 1). The source diffusion 36 is coupled by a sidewall-defined bridge contact 30 to the portion of the first polysilicon layer 22 that extends above the surface of the epitaxial region 12. The bridge 30 is insulated from the gate electrode 22 by a sidewall-defined insulating layer 32.

In operation, voltages on bit line 42 are coupled from the drain diffusion 38 to the source diffusion 30 when the gate electrode 34 is at a high voltage. The bridge contact 30 insures that the voltage of polysilicon layer 22 is the same as that of source diffusion 36. Thick polysilicon layer 24, the second dielectric layer 26A and the thin polysilicon layer 22 form a "poly-to-poly" storage capacitance. The thin polysilicon layer 22, the first dielectric layer 26 and the wafer 100 form a "poly-to-substrate" storage capacitance. That is, since both the second polysilicon layer 24 and the substrate 10 are at ground, the dielectric layers 26, 26A provide a dual poly-to-poly and poly-to-substrate storage capacitance whose charge/discharge is controlled by the voltage state of the thin polysilicon layer 22 coupled to the source diffusions 36 on each side of the trench. By controlling the thickness of the two dielectric layers, the charge storage capacity of one of the capacitors can be greater than that of the other. It has been found that oxide formed on polysilicon may have surface discontinuities that may promote hot carrier injection. The effect of these injected carriers may be minimized by increasing the thickness of the dielectric layer. Accordingly, the second dielectric 26A is thicker than the first dielectric 26, such that the poly-to-poly storage capacitance is enhanced. Moreover, in accordance with the teachings of the above-cited U.S. patent application, Ser. No. 626,512, by extending the filled trench through the n-well 14 to the heavily-doped substrate 10, the poly-to-substrate capacitance is also enhanced. In combination, the enhanced poly-to-poly and enhanced poly-to-substrate capacitances greatly increase the composite storage capacitance at each side of the trench, such that a greater amount of charge may be stored in a smaller lithographic space. The ability to store more change in less space is essential as the dynamic random access memory chips of the future reach densities of one million storage cells per chip and beyond.

FIG. 1 shows a top view of a section of an array of memory cells of the present invention. The word lines 34 forming the gate electrodes of the FETs run parallel to the trench 20. Note that the FETs are disposed in a spaced relationship along each side of the trench 20. The spaces between the cells are defined by thick isolation layer 28 that are disposed orthogonally with respect to trench 20 to isolate adjacent cells that access the same side of the same trench from each other. As shown in the hatched box labelled "cell," each memory cell takes up a chip surface area in the order of four lithographic squares, a "square" being defined as the minimum image size that can be printed using a given photolithographic exposure system. That is, going from left to right within the hatched box, each cell uses one-half the width of the lithographically-defined drain diffusion 38 (that is, because the drain diffusion 38 is shared by two adjacent cells that access adjacent trenches, the lithographic space is divided between the cells), the entire width of the sidewall-defined gate electrode 34 (which, due to its self-aligned properties, may have a width that is less than the photolithographic limits), and one-half the width of the lithographically-defined trench 20; going from bottom to top within the hatched box, each memory cell uses one-half the width of a first lithographically-defined isolation region 28, the full width of the lithographically-defined bit line 42, and one-half the width of a second lithographically-defined isolation region 28. Since each side of the box is approximately ($\frac{1}{2}+1+\frac{1}{2}$), the total area of each cell in the order of four lithographic squares or less.

Figure 3:
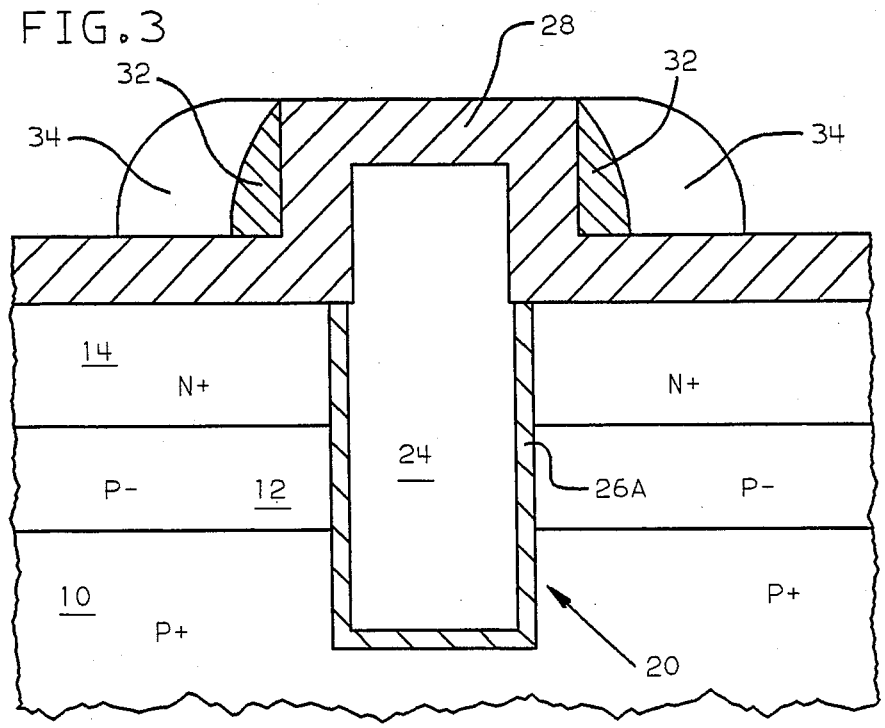
FIG. 3 is a cross-sectional view taken along line 3—3 of FIG. 1.

FIG. 3 shows a cross-sectional view of the isolation region between memory cells. Trench 20 is filled with only a single layer of polysilicon 24. Note that insulating layer 26A (and possibly a residual portion of insulating layer 26, not shown) separates polysilicon 24 from the monocrystalline silicon in the isolation regions. An insulating layer 28 is formed uniformly over the substrate in the isolation regions. Note that gate electrodes 34 are formed over the insulating layer (see FIG. 1).

The method of forming the memory cell of the invention will now be described with reference to FIGS. 4–9. An epitaxial layer 12 is first grown on a substrate 10. Both the epitaxial layer 12 and the substrate 10 are doped with boron. The dopant concentrations are controlled such that the substrate 10 has a much greater concentration than does the epitaxial layer 12. The higher P concentration in substrate 10 tends to promote recombination of any majority carriers that may be injected through epitaxial layer 12. Moreover, the difference in dopant concentration produces an electric field that will tend to oppose the injection of minority carriers (i.e., electrons) from the active devices into the substrate. Such injection would materially alter the threshold voltages of the transistors, to thus seriously degrade the reliability of the various circuits formed on the chip.

A layer of silicon dioxide 50 is grown on the substrate. The silicon dioxide is grown using conventional techniques, such as exposing the substrate to an oxidizing atmosphere (e.g., wet $O_2$) at a temperature of approximately 800° C. The silicon dioxide layer should be of sufficient thickness (e.g., 30 nm) to retard crystal dislocations in the substrate that may be imparted by film stresses induced by overlaying layers.

A layer of silicon nitride 52 is then deposited on the silicon oxide layer. The silicon nitride layer is formed using low pressure chemical vapor deposition (LPCVD) techniques, using $NH_3$ and $SiH_2Cl_2$ as the deposition gasses. Typically, this nitride layer is grown to 40 nm in thickness.

A layer of N+ type polycrystalline silicon 54 is then formed on the nitride layer 32 using conventional chemical vapor deposition techniques. The silicon layer is typically in the order of one micron in thickness. As the silicon layer is deposited, arsenic or phosphorus based gases are introduced at a sufficient concentration such that the layer 54 is N+ doped.

One or more layers are then deposited on the upper surface of the N+ silicon layer. These layers protect the N+ silicon layer during subsequent processing. As will be described in more detail below, these layers also serve as an etch-stop when the trench fill is replanarized. For example, if chemical-mechanical polishing techniques are used, these layers should have a much slower polish rate than silicon such that the trench fill etch substantially stops when these layers are exposed. If a reactive ion etch (RIE) is used to etch back the trench fill, these layers should be substantially etch resistant in the gas ambient used to etch silicon. In the invention, layers of silicon dioxide 56 (50-75 nm) and silicon nitride 58 (100 nm) are deposited on top of the N+ silicon layer to form the etch-stop.

Figure 4:
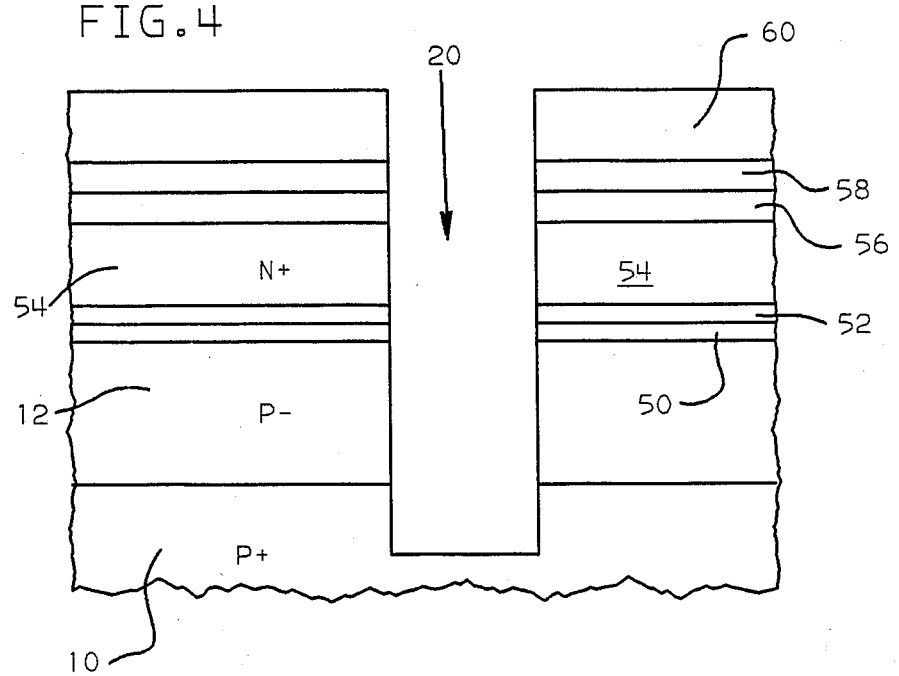
FIGS. 4–9 present cross-sectional and top views of the random access memory cell of the present invention at various stages of production.

A photosensitive polymer 60 is then applied on top of the upper nitride layer, and a RIE etch sequence is then used to etch through all of the overlaying layers to form trench 20 at least 5.0 µm deep into epi layer 12 and substrate 10. The resulting structure is shown in FIG. 4. The polymer 60 (which may be any commercially available photoresist) is exposed and developed in the conventional manner. Then a sequence of etch ambients are introduced to anisotropically etch the stack of layers formed on substrate 10. For example, the upper and lower silicon oxide layers 56 and 50, respectively, and the upper and lower silicon nitride layers 58 and 52 can be etched in a $CF_4$ plasma. The N+ silicon layer 54 and the silicon substrate 10 may be etched in any plasma (e.g. a chlorine-based RIE) that produces an anisotropic profile in silicon. After the trench 20 is defined, any remaining photoresist 60 may be removed using wet etch (n-methyl pyrrolidone) or dry etch ($O_2$ plasma) techniques.

Figure 5:
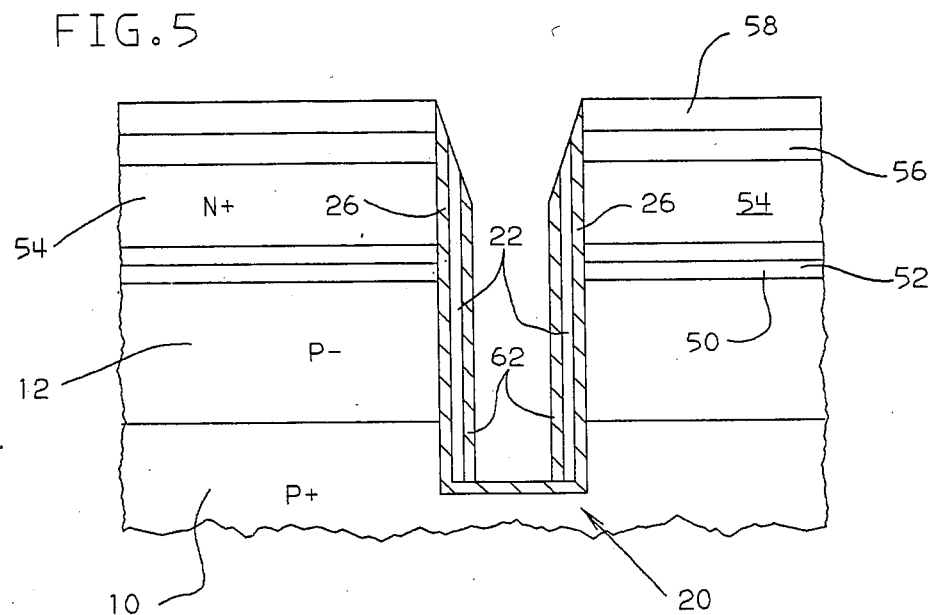

A series of conformal layers are then formed and etched to coat the trench sidewalls as shown in FIG. 5. The first conformal layer 26 is made of a composite structure of silicon oxide (4 nm)—silicon nitride (4-7 nm)—silicon oxide (2 nm) that is formed by oxidizing the trench sidewalls, then depositing the silicon nitride using CVD techniques, and then oxidizing the nitride. While other dielectrics (e.g. silicon oxynitride) could be used, it has been found that the above composite structure provides the combination of low D.C. leakage, high dielectric constant, and high breakdown voltage that is needed for high density dynamic RAM applications as in the present invention. The second conformal layer 22 is a 50 nm layer of undoped polysilicon, formed by conventional techniques. The third conformal layer 62 is a layer of CVD silicon oxide that is doped with boron ions. These layers are then reactive ion etched so that layers 62 and 22 are removed from the surface of silicon nitride 58 and from the trench bottom. Note that the etch is terminated after polysilicon layer 22 is completely removed from silicon nitride layer 58, such that dielectric layer 26 remains on the bottom of the trench to isolate the remaining portions of polysilicon layer 22 on each side of the trench. Due to the anisotropic nature of the RIE, all three layers remain on the sidewalls of trench 20. The upper portions of the layers are tapered due to partial attack during the RIE.

Figure 6A:
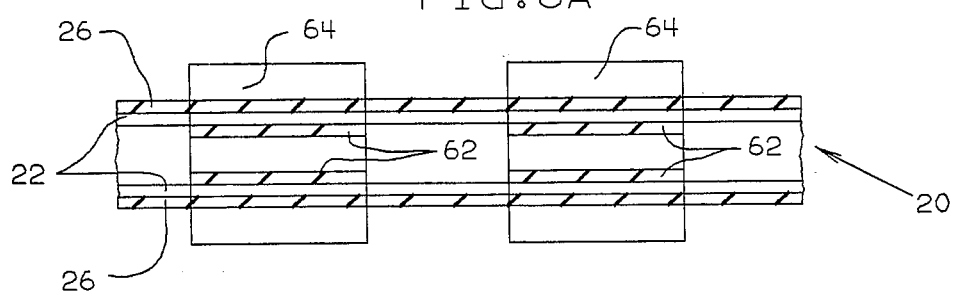
Figure 6B:
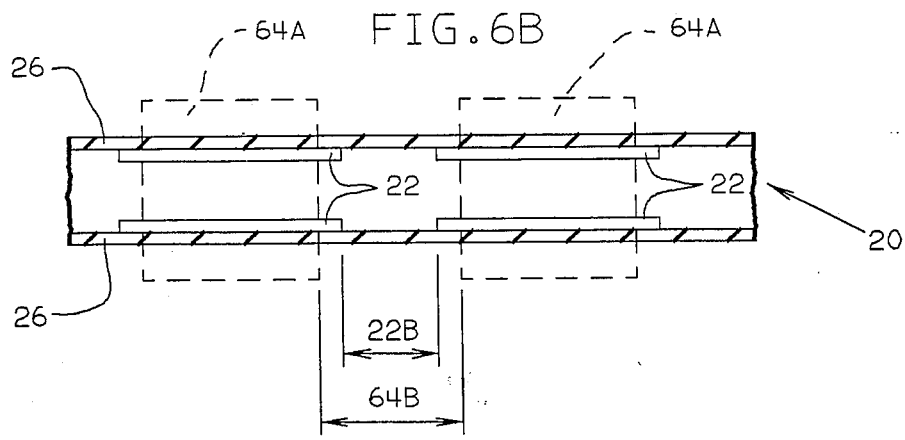

Next, as shown in FIGS. 6A-6B, a process sequence is utilized to define adjacent storage nodes along the sides of the trench. In general, FIGS. 6A-6B show a top view of the substrate at two discrete points in this process sequence. First, masking structure 64 is applied to the substrate. The masking structure 64 is used to expose lateral portions of the doped oxide layer 62 formed on the sidewalls of trench 20. Using a conventional single-layer photoresist technique, providing such a deep pattern would be difficult. Accordingly, in the present invention the use of multiple patterned layers is preferred. The masking structure is formed of upper and lower patterned layers. The lower layer must be formed of a flowable material (e.g. photoresist or polyimide) that can fill portions of the trench 20. After the upper layer is patterned through a photoresist, the upper layer forms a mask through which exposed portions of the lower layer are removed. Note that the compositions of the upper and lower layers must be chosen so that the upper layer is not etched while the lower layer is being patterned. Numerous layers (e.g. two photoresist layers having different etch characteristics, two polyimide layers at different levels of curing, or an upper layer of silicon oxide or nitride or silicon combined with a lower layer of polyimide or photoresist) could be used to form the upper and lower layers of the multi-layered masking structure 64. Portions of trench 20 exposed by mask 64 are then plasma etched to remove doped oxide layer 62 from the trench sidewalls. Note that the use of a plasma etch (isotropic), as opposed to a RIE (anisotropic), attacks both the horizontal and vertical surfaces of the exposed trench. Note also that the portions of trench 20 that are exposed by mask 62 will ultimately provide isolation between adjacent nodes defined along the trench. The mask 64 protects those areas of trench 20 where storage nodes are to be formed.

After the mask 64 is removed by an appropriate etch step, an anneal is carried out to drive the boron dopant ions from the remaining doped oxide 62 into the undoped polysilicon 22. The anneal may be carried out in an inert atmosphere such as $N_2$. However, since the doped oxide layer 62 is to be subsequently removed, the anneal step may be carried out in an oxidizing atmosphere. Any oxide formed thereby is removed along with oxide layers 62 and 56 by buffered HF etching. Since the doped oxide was heavily doped, a large amount of dopant ions pass from the doped glass into the thin polysilicon layer. Then, the undoped portions of polysilicon layer 22 are selectively removed, resulting in the structure shown in FIG. 6B. An important attribute of this process sequence is that during the anneal step boron diffuses laterally such that the spacing between adjacent boron-diffused nodes is below the photolithographic capabilities of the exposure system. That is with reference to FIG. 6B, note that the thin polysilicon layer 22 laterally extends beyond the photolithographically defined image 64A, such that the spacing 22B between adjacent poly lines 22 is less than the photolithographically defined space 64B. Therefore, using this lateral diffusion technique a minimum spacing is obtained independent of the particular photolithographic method utilized. Note that any known etchant that exhibits a high undoped silicon-to-doped silicon etch ratio (e.g. KOH in alcohol) could be used to define the boron-diffused nodes. Note that the order of etch steps (i.e., removing doped oxide and then removing the undoped polysilicon) could be reversed as long as the anneal is carried out in a non-oxidizing ambient.

After the above process sequence is completed, a second insulating layer 26A is applied to the structure. The insulating layer 26A forms a dielectric that covers the doped polysilicon layer 22 and the exposed first insulating layer 26. Preferably, the second insulating layer 26A is formed of a composite oxide-nitride-oxide structure, as was the first insulating layer 26. Then, a layer of P+ doped polysilicon 24 is applied to the structure to over-fill the trench 20. The doped polysilicon 24 may be formed using conventional techniques (e.g., CVD using silane as the source gas). The polysilicon 24 is then etched back so that it is planar with etch-stop layer 58. As previously discussed, any one of a number of known planarization techniques (RIE etchback by deposition of a planar layer having the same etch rate as polysilicon 24, chemical-mechanical polishing) can be used to planarize the polysilicon fill to etch-stop layer 58. In the invention, chemical-mechanical polishing is preferred. Then, using the nitride layer 58 as a mask, the exposed surface of the polysilicon fill 24 is oxidized by exposure to an oxidizing atmosphere, forming a 200 nm silicon oxide cap 66. See FIG. 7.

Figure 7:
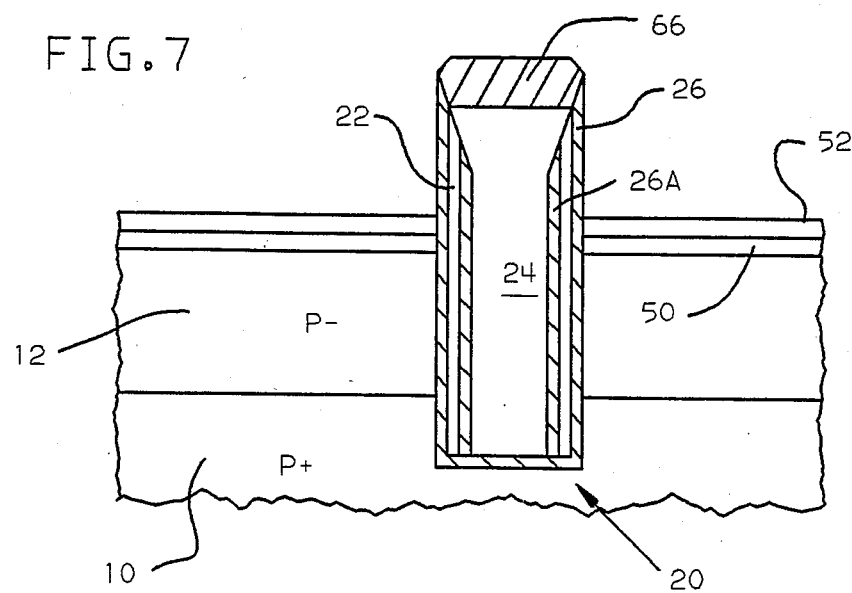

Using the oxide cap 66 as a mask, the nitride layer 58 and underlaying oxide layer 56 is removed by exposure to a $CF_4$ RIE. Then, the N+ layer 54 is removed by exposure to a wet nitric/HF-based etchant that does not appreciably attack the oxide cap 66 or the underlying nitride layer 52. The resulting "mandrel structure" (i.e., portions of poly layers 22 and 24 and dielectric layers 26 and 26A which form a trench overfill that vertically extends above the silicon surface) is shown in FIG. 7.

A conventional N-well photolithographic mask is then formed by deposition, exposure and development of a photoresist layer. Note that in the CMOS technology of the present invention, all of the memory cells are formed in the N-well. Although CMOS is preferred for the low power consumption it provides for the memory support circuits such as the data buffers, decoders, drivers, etc., it is to be understood that (with minor modifications) the memory cells of the invention could be formed directly in a P—type region. In the present invention, the N-well 14 is formed by phosphorus implantation at $10^{17}$ ions/cm$^3$ into the memory cell regions, so that it extends through a substantial portion (e.g. two-thirds) of the thickness of the epitaxial layer.

Then a 20 nm layer of nitride is deposited on the substrate, to help define those regions in which oxide isolation is to be formed. The 20 nm nitride is then RIE etched to remove it from horizontal surfaces, leaving it on the mandrel sidewalls. It is necessary to stop this etch step in time to leave intact >50% of the underlying 30 nm nitride layer 52. The remaining nitride 52 is anisotropically etched through a photolithographic mask to define those areas of the surface where isolation regions are to be formed. Then, the surface regions of the wafer exposed by the patterned nitride are subjected to an oxidizing ambient for a sufficient length of time to form a semi-recessed oxidation (S-ROX) pattern 28 as shown in FIG. 1. Note that during this oxidation step the silicon beneath the oxide cap 66 is further oxidized so as to form an S-ROX structure 28 on top of the filled trench 20. As this S-ROX structure is formed, it will deform the nitride on the sidewalls of the mandrel structure trench, producing lateral ends 28A that overhang the sidewalls of the trench 20. The importance of this structural feature will become more apparent below.

Figure 8:
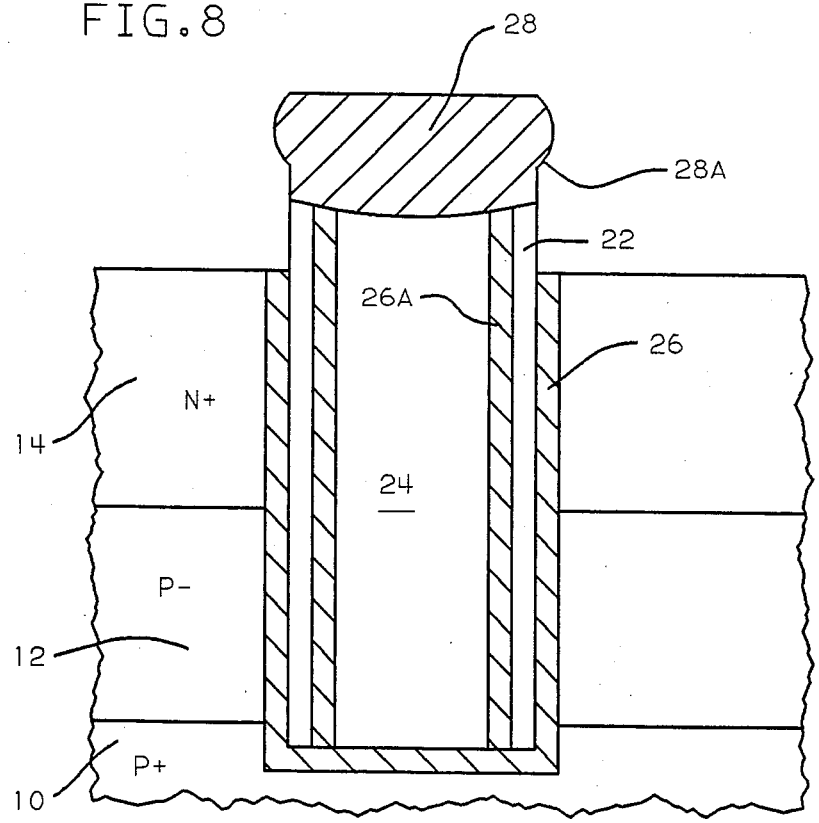

After the S-ROX pattern is defined, the nitride layer (including the portions thereof on the sidewalls of the trench overfill) is etched by wet etching techniques (e.g. hot $H_3PO_4$). Note that nitride layer 52 is also removed during this step. Then, a brief plasma etch sequence is completed to remove the remaining nitride and oxide components of dielectric layer 26 as well as oxide layer so, such that the polysilicon layer 22 is exposed. The resulting structure is shown in FIG. 8.

Figure 9A:
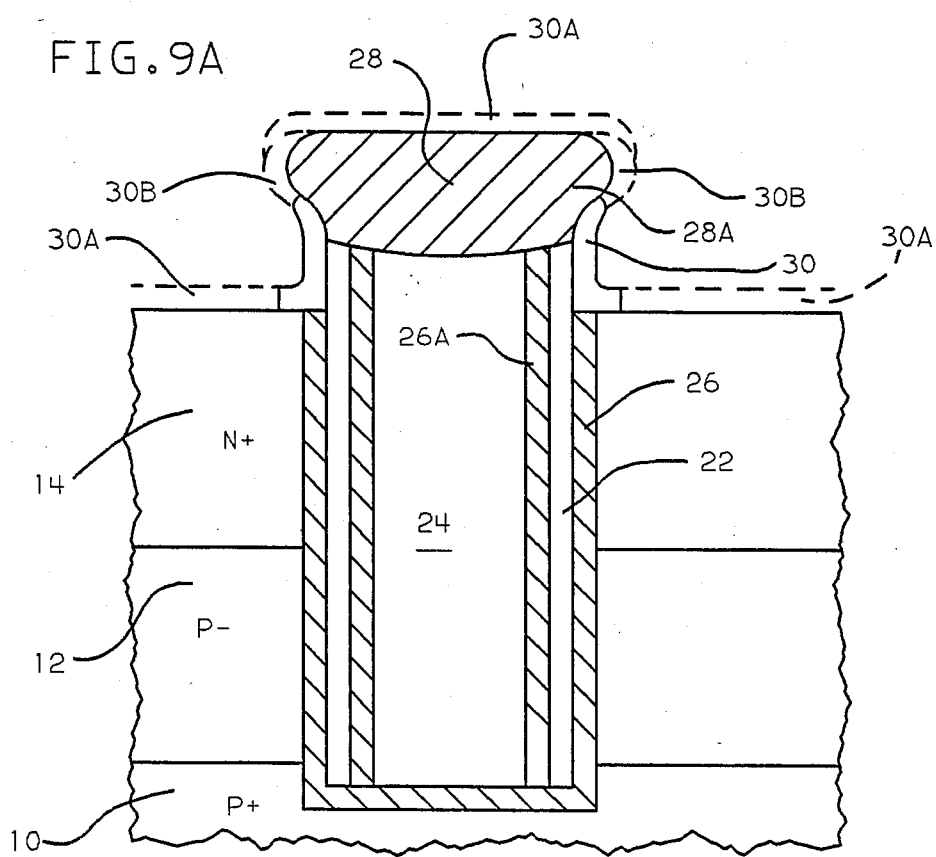
Figure 9B:
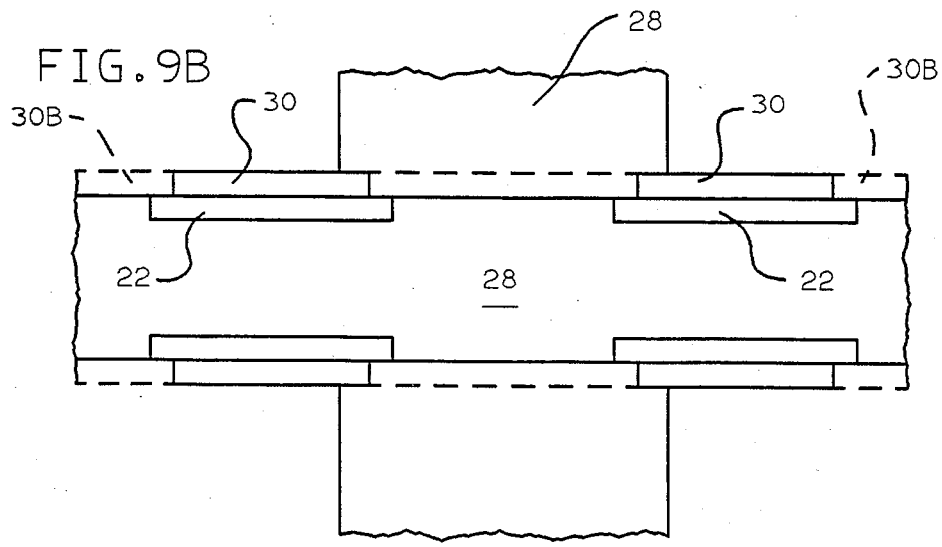

As shown in FIG. 9A, a conformal layer of polysilicon 30A is then deposited on the structure, using the same techniques that were utilized to form polysilicon layer 22. The conformal layer is anisotropically etched in a RIE mode, such that portions 30B remain only on the sidewalls of the trench fill and isolation region 28. Because of the lateral portion 28A of the oxide isolation region 28, a small horizontal portion of the conformal layer is protected (and hence not removed) during the anisotropic etch. Using the same drive-in technique that was used to dope polysilicon layer 22, an anneal is carried out in an inert ambient at approximately 800° C. so that boron diffuses from the polysilicon layer 22 into the vertical portion of the conformal layer of polysilicon, and through the horizontal portion of the polysilicon layer 22 into a portion of the n-well 14 thereunder to form a diffusion region 36 self-aligned to the conformal layer. In this manner, the conductivity of the conformal layer may be controlled without resorting to doping the layer through conventional photolithographic techniques. Note that, similarly to the initial doping of polysilicon 22, the boron diffuses laterally so that the spacing between adjacent boron doped regions is less than the photolithographic limits (see FIG. 9B). Then, the polysilicon layer is exposed to an etchant (KOH in alcohol for example) that has a high undoped polysilicon-to-doped polysilicon selectivity, such that (as shown in FIG. 9B) undoped portions of polysilicon region 30B that are removed, leaving doped polysilicon region 30 to form a conductive bridge that establishes contact between the polysilicon layer 22 and the P+ diffusion 36 formed thereunder by boron outdiffusion. Note also that by use of this method, the polysilicon bridge contact 30 is totally self-aligned with respect to both the polysilicon 22 and the contacted P+ diffusion 36. Again, this eliminates several costly mask-and-etch steps.

After the bridge contact 30 is formed, a conformal layer of silicon oxide is applied using conventional CVD techniques. Similarly to the polysilicon layer 30A, this layer of oxide is then anisotropically etched (preferably in an $O_2$ RIE) to form a sidewall insulator 32 (see FIG. 1) that isolates the conductive bridge 30 from other conductors.

After the sidewall insulator is defined, a gate insulator 34A is formed on the exposed silicon substrate. See FIG. 1. Preferably, this gate insulator is formed by thermal oxidation of the exposed silicon. Then a thick layer of conformal polysilicon is deposited over the entire structure, and similarly to previous steps the polysilicon is anisotropically etched in a RIE mode to form sidewall-defined gate electrodes 34. Forming the gate electrode by sidewall techniques reduces the achievable channel length, in that the lateral length of the gate electrode is now a function of the thickness of the polysilicon as-deposited rather than being a function of the limits of the photolithographic exposure system. After the gate electrode is formed and covered by a thin layer of protective oxide, boron ions are implanted into areas of the substrate exposed by the gate electrode, and an anneal cycle is carried out to diffuse these dopant ions into the substrate to produce the drain diffusion 38. During this anneal cycle, boron dopant ions will continue to diffuse from the portion of conductive bridge 30 overlaying the substrate, expanding the self-aligned P−type source diffusion 36 to underlap the poly silicon gate electrode. Note that concentration of the sequence of ¼+ diffusions is not critical except that it must be above about $7 \times 10^{19}/cm^3$ to produce the preferential etching selectivity. The manufacturing process is then completed by depositing a thick layer of doped glass (PSG or BPSG) 40, lithographically defining openings through the glass, and depositing a layer of metal 42 to contact the drain diffusions 38 at a juncture 44.

In the above-described manufacturing process, a sequence of sidewall-defined structures (contact bridge 30, insulating layer 32, and gate electrode 34) are all formed relative to the trench overfill, to establish the electrical and physical coupling of the filled trench 20 to the transfer gate FET. Moreover, by providing a combination of poly-to-poly and poly-to-substrate storage capacitance, the resulting memory cell has a sufficient charge storage capability to be useful in a highly dense dynamic RAM chip design.

There are two rather important components of the processing sequence described above. One is the ability to form a thin storage node dielectric that provides the necessary charge storage capabilities, particularly between the two polysilicon layers. It has been found that the oxide-nitride-oxide combination provides such a capability. A particularly good way of forming this stack includes the following steps. The exposed silicon is first oxidized by introducing an $HCl/O_2$ gas flow at 800° C. for 13 minutes, and annealing the structure at 800° C. for 10 minutes in an inert atmosphere. The resulting oxide layer is on the order of 4 nm thick. Then the wafer is exposed to a gas combination of $N_2$ (nominal), $NH_3$ (130 sccm), and $SiH_2Cl_2$ (10 sccm) for a sufficient time to create a 7 nm nitride layer having an index of refraction of 1.95-2.05. Then the wafer is subjected to a dry $O_2$ (15 minutes at 1000° C.) dry $O_2$—wet $O_2$—dry $O_2$ oxidation sequence (all at 1000° C. for a time sufficient to form a 2 nm thick layer of silicon oxide on the nitride.

The second important component of the processing sequence is the ability to diffuse boron dopant from the highly doped oxide 62 to poly 22, from poly 22 to the conducting bridge 30, and from the conducting bridge 30 to the substrate surface to form a P+ source region 36 in an N-well 14. At the high minimum concentration of $7 \times 10^{19}$ ions/cm$^3$, this diffusion is reasonably forgiving, (i.e. it does not require control tighter than about ±50%).

It is to be understood that while the present invention has been described with reference to a particular embodiment, various modifications can be made to the structures and teachings presented herein without departing from preview of the invention as recited in the several claims appended hereto.

I claim:

1. A one-device dynamic random access memory cell, comprising a trench formed in an exposed surface of a semiconductor substrate, said trench being filled with at least a first polysilicon layer and at least one dielectric layer for isolating said first polysilicon layer from said substrate, at least a portion of said first polysilicon layer extending above said surface of said substrate to define a mandrel structure thereon;

at least one transistor device disposed on a portion of said substrate adjacent one side of said trench, said transistor having first and second conducting electrodes formed within said surface of said substrate to define a channel region therebetween and a third control electrode disposed above and insulated from said channel region; and a sidewall-defined bridge contact disposed on said mandrel structure, said bridge contact having a vertical portion in contact with said portion of said first polysilicon layer extending above said surface of said substrate, and a horizontal portion in contact with one of said control electrodes of a respective one of said plurality of transistor devices, said bridge contact comprising a second polysilicon layer selfaligned to said first polysilicon layer.

2. A one-device dynamic random access memory cell, comprising:

a trench formed in an exposed surface of a semiconductor substrate, said trench having substantially vertical sidewalls, said trench being filled with at least a first layer of doped polysilicon and at least one dielectric layer that insulates said first polysilicon layer from said substrate, a portion of said first polysilicon layer vertically extending above said surface of said substrate to define a mandrel structure;

a plurality of field effect transistors formed on said substrate and disposed in a spaced relationship along either side of said trench, each of said transistors comprising first and second conducting electrodes formed by diffusion regions within said exposed surface of said substrate, said diffusion regions defining a channel region therebetween, and a gate electrode disposed above and insulated from said channel region; and a plurality of sidewall-defined conductive bridge contacts disposed in a spaced relationship along either side of said trench, each of said bridge contacts comprising a second layer of polysilicon having a vertical portion that contacts said portion of said first polysilicon layer vertically extending above said surface of said substrate, and a horizontal portion that contacts an underlaying one of said diffusion regions of a respective one of said plurality of field effect transistors, said second polysilicon layer being self-aligned to said first polysilicon layer and to said underlaying one of said diffusion regions.

3. A one-device dynamic random access memory cell, comprising:

an elongated trench formed in an exposed surface of a semiconductor wafer, said trench having substantially vertical sidewalls, said trench being filled with at least a doped first polysilicon layer and at least one dielectric layer that insulates said first polysilicon layer from said wafer, a portion of said first polysilicon layer extending above said surface of said wafer to form a mandrel structure having a horizontal surface and vertical surfaces;

a plurality of field effect transistors formed on said wafer and disposed in a spaced relationship along either side of said trench, each of said transistors comprising first and second conducting electrodes formed by diffusion regions within said exposed surface of said wafer, said diffusion regions defining a channel region therebetween, and a sidewall-defined gate electrode disposed above and insulated from said channel region;

a plurality of sidewall-defined conductive bridge contacts disposed in a spaced relationship along either side of said trench, said bridge contacts comprising a second layer of polysilicon coated on said mandrel structure, each of said bridge contacts having a vertical portion that contacts said vertical portion of said mandrel structure and a horizontal portion that contacts an underlaying one of said diffusion regions of a respective one of said plurality of field effect transistors said bridge contacts being self-aligned to said first polysilicon layer and to said underlaying one of said diffusion regions; and an insulating layer formed on said sidewall-defined bridge contacts for insulating said bridge contacts from said sidewall-defined gate electrode of a respective one of said plurality of transistors, said sidewall-defined gate electrodes of said transistors being formed of a third polysilicon layer coated on said mandrel structure, each of said gate electrodes having a vertical surface that contacts said insulating layer and a horizontal surface disposed above said channel region.

4. The memory cell of claim 3, wherein said wafer comprises a semiconductor substrate of a first conductivity type, an epitaxial silicon layer of said first conductivity type coated on said silicon substrate, and a well region of a second conductivity type formed in said epitaxial layer, said well region extending through a substantial portion of said epitaxial layer.

5. The memory cell of claim 4, wherein said semiconductor substrate has a concentration of first conductivity type dopant ions that is greater than that of said epitaxial layer.

6. The memory cell of claim 4, wherein said elongated trench vertically extends downward through both of said well region and said epitaxial layer into said semiconductor substrate.

7. The memory cell of claim 6, wherein said trench is at least approximately 5.0 μm deep.

8. The memory cell of claim 4, wherein said trench is filled with said first dielectric layer, said first polysilicon layer, a second dielectric layer and a fourth polysilicon layer, said first polysilicon layer and said first dielectric layer forming a poly-to-substrate storage capacitance with said substrate, and said fourth polysilicon layer and said second dielectric layer forming a poly-to-poly storage capacitance with said first polysilicon layer.

9. The memory cell as recited in claim 8, wherein each of said first and second dielectric layers are comprised of a material selected from the group consisting of silicon oxide, silicon nitride, and silicon oxynitride.

10. The memory cell as recited in claim 9, wherein each of said first and second dielectric layers comprise a composite silicon oxide-silicon nitride silicon oxide structure.

11. The memory cell as recited in claim 8, wherein said mandrel structure is formed by portions of said first polysilicon layer, said second dielectric layer, and said fourth polysilicon layer that extend above said surface of said wafer.

12. The memory cell as recited in claim 11, wherein said mandrel structure has a thick insulating layer of silicon oxide on its upper surface.

13. The memory cell as recited in claim 3, wherein the other of said conductive electrodes is shared by two laterally adjacent transistor devices, said shared conductive electrode being coupled to a metal line.

14. The memory cell as recited in claim 13, wherein said metal line is disposed above said wafer and insulated therefrom by a thick layer of doped glass having apertures therein through which said metal layer contacts said shared conductive electrode.

15. The memory cell as recited in claim 3, wherein a portion of said sidewall of said elongated trench abutting a given transistor provides a storage capacitance thereto, said wherein said transistors are spaced by a series of parallel insulating silicon oxide lines disposed above said elongated trench and running in a direction orthogonal thereto.

16. The memory cell of claim 15, wherein each memory cell has a surface area of no more than four lithographic squares.

17. A one-device dynamic random access memory cell, comprising:

a deep, elongated trench formed in an exposed surface of a semiconductor substrate, said trench having elongated sidewalls and a bottom surface, said trench being filled with a first dielectric layer coating said sidewalls and said bottom of said trench, a first polysilicon layer on said first dielectric layer, a second dielectric layer on said first polysilicon layer, and a second polysilicon layer on said second dielectric layer, portions of said first polysilicon layer, said second dielectric layer and said second polysilicon layer vertically extending above said surface of said substrate to define a mandrel structure thereon;

a plurality of field effect transistors formed on said substrate and disposed in a spaced relationship along said sides of said trench, each of said transistors comprising first and second conducting electrodes formed by diffusion regions within said surface of said substrate, said diffusion regions defining a channel region teerebetween, and a sidewall-defined gate electrode formed of a fourth layer of polysilicon coated on said mandrel, said gate electrode being disposed above and insulated from said channel region;

a plurality of sidewall-defined conductive bridge contacts disposed on either side of said trench, each of said bridge contacts being formed from a third layer of polysilicon coated on said mandrel, each of said bridge contacts having a vertical portion that contacts said portion of said first polysilicon layer vertically extending above said surface of said substrate and a horizontal portion that contacts an underlaying one of said diffusion regions of a respective one of said plurality of field effect transistors, said bridge contacts being self aligned to said portion ions therefrom, and being self-aligned to said underlaying diffusion region by producing dopant ions therefor; and a sidewall-defined insulation layer formed from a layer of silicon oxide coated on said mandrel, said insulation layer being formed over said plurality of bridge contacts to insulate said contacts from said sidewall-defined gate electrodes.

18. A dynamic random access memory cell, comprising:

an elongated trench formed in an exposed surface of a semiconductor wafer, said wafer comprising a semiconductor substrate of a first conductivity type, an epitaxial layer of said first conductivity type formed on said substrate, and a well region of a second conductivity type formed in said epitaxial layer, said trench vertically extending downward through said well region and said epitaxial region into said substrate, said trench having substantially vertical sidewalls and a bottom surface;

a first dielectric layer coated on said sidewalls and bottom of said trench;

a first layer of polysilicon of said first conductivity type on portions of said first dielectric layer on said sidewalls of said trench said first polysilicon layer, said first dielectric layer and said substrate providing a poly-to-substrate storage capacitance;

a second dielectric layer coated on said first layer of polysilicon;

a second layer of polysilicon of said first conductivity type formed on said second dielectric layer so as to fill said trench, said second polysilicon layer, said second dielectric layer and said first polysilicon layer providing a poly-to-poly storage capacitance, upper portions of said second polysilicon layer, said second dielectric layer and said first polysilicon layer forming a mandrel structure on said surface of said semiconductor substrate;

a plurality of field effect transistors formed on said substrate and disposed in a spaced relationship along said sides of said trench, each of said transistors comprising first and second conducting electrodes formed by diffusion regions within said surface of said substrate, said diffusion regions defining a channel region therebetween, and a sidewall-defined gate electrode formed of a fourth layer of polysilicon coated on said mandrel, said gate electrode being disposed above and insulated from said channel region;

a plurality of sidewall-defined conductive bridge contacts disposed on either side of said trench, each of said bridge contacts being formed from a third layer of polysilicon coated on said mandrel, each of said bridge contacts having a vertical portion that contacts said portion of said first polysilicon layer vertically extending above said surface of said substrate and a horizontal portion that contacts one of said diffusion regions of a respective one of said plurality of field effect transistors, said bridge contacts being self aligned with respect to said first polysilicon layer by receiving dopant ions therefrom;

a sidewall-defined insulation layer formed of a layer of silicon oxide coated on said mandrel, said insulation layer being formed over said plurality of bridge contacts to insulate said contacts from said sidewall-defined gate electrodes.

* * * * *